（12）United States Patent
Iwamuro

(10) Patent No.: US 6,346,740 B1
(45) Date of Patent: Feb. 12, 2002

(54) SEMICONDUCTOR DEVICE

(75) Inventor: Noriyuki Iwamuro, Nagano (JP)

(73) Assignee: Fuji Electric Co., Ltd. (JP)

( * ) Notice: Subject to any disclaimer, the term of this patent is extended or adjusted under 35 U.S.C. 154(b) by 0 days.

(21) Appl. No.: 09/517,153

(22) Filed: Mar. 2, 2000

(30) Foreign Application Priority Data

Mar. 2, 1999 (JP) .......................................... 11-053483

(51) Int. Cl.$^7$ ............................................ H01L 29/861
(52) U.S. Cl. .................. 257/587; 257/577; 257/593
(58) Field of Search ................................. 257/565, 577, 257/587, 593; 438/91, 92

(56) References Cited

U.S. PATENT DOCUMENTS 5,939,768 A * 8/1999 Palara ........................ 257/577
6,221,688 B1 * 4/2001 Fujihira et al. ............... 438/92

FOREIGN PATENT DOCUMENTS

| JP | 6-37320 A | * | 2/1994 | ......... H01L/29/784 |
| JP | 10-326900 A | * | 12/1998 | ......... H01L/29/861 |

OTHER PUBLICATIONS

M. Mori et al.; "A Novel Soft and Fast Recovery Diode (SFD) with Thin P–Layer Formed by Al–Si Electrode"; 6/91; pp. 113–117; CH2987–6/91/0000–0113 IEEE.

A. Porst et al.; "Improvement of the Diode Characteristics Using Emitter–Controlled Principles (EMCON–Diode)"; 2/97; pp. 213–216; 1997 IEEE, 0–7803–3993.

* cited by examiner

Primary Examiner—Allan R. Wilson
(74) Attorney, Agent, or Firm—Rossi & Associates

(57) ABSTRACT

To provide a semiconductor device that has a positive ON-voltage temperature coefficient and a high switching speed at the current densities provided during actual operation. A (p) anode layer 1 is formed on one surface of an (n) base layer 3 having high resistance, and an (n) cathode layer 2 is formed on the other surface. The surface of the (p) anode layer 1 is coated with an insulating film having contact slots formed therein, and the anode electrode 5 is formed on the (p) anode layer 1 and is fixed to the (p) anode layer 1 at the locations of the contact slots 7. A cathode electrode 6 is formed on the (n) cathode layer 2. In addition, the planar pattern of the contact slots 7 is shaped like stripes. The area ratio $S_1/S_2$ is 5 or more and 30 or less, where area $S_1$ constitutes the (p) anode layer 1 that is occupied by an insulating film 4 (the area of a non-secured portion), and area $S_2$ represents the locations of the contact slots 7 (the area of the secured portion). This setting can make the temperature coefficient of the ON-voltage positive. In addition, the lifetime is shortened to increase the switching speed.

4 Claims, 4 Drawing Sheets

SEMICONDUCTOR DEVICE

FIELD OF THE INVENTION

The present invention relates to a semiconductor device such as a free wheel diode for use in reverse parallel connection with an insulated gate bipolar transistor (IGBT).

BACKGROUND ART

In recent years, IGBTs have significantly advanced to achieve a low on-voltage characteristic and a fast-switching characteristic (a reverse recovery characteristic) and are approaching their theoretical limits. Under the circumstances, much attention is being paid to the characteristics of diodes integrated into IGBT modules. Such diodes require a low ON-voltage and fast-switching capabilities, but the focus is placed on the dependency of the ON-voltage on temperature. This is because the recent increase in the size of the IGBT module has increased the number of diode chips integrated into the module and operating in parallel.

If a semiconductor converter with an IGBT module mounted thereon fails for any reason, a large current flows through the IGBT module and naturally through the diodes therein. If the diodes have a negative temperature coefficient, that is, are characterized in that their ON-voltage decreases with increasing temperature, then of the plurality of diodes connected in parallel, those through which a large current flows undergo an increase in temperature, reducing the ON-voltage to cause a much larger current to flow through. Finally, those diodes in which the current concentrates are destroyed.

The diodes include pn diodes formed using simple pn junctions and Shottky diodes that are unipolar elements. The pn diodes involve injection of minority carriers, so the diffusion potential of the pn junction decreases with increasing temperature. In addition, in order to improve the switching characteristic, a lifetime killer is normally introduced into the semiconductor using heavy metal or electron beams to shorten lifetime. The lifetime killer, however, has its effects weakened as the temperature increases. These phenomena serve to reduce the ON-voltage as the temperature increases. In addition, it is difficult to make this decrease in ON-voltage uniform among the diodes, and the temperature characteristic varies among the diodes. This variation may subject some diodes to current concentration, as described above.

On the other hand, due to the lack of injection of minority carriers, the Shottky diodes undergo an increase in ON-voltage as the temperature increases, and have a high switching speed. These diodes, however, have a high ON-voltage value.

A. Prost et al. have reported in Proc. of IEEE ISPSD '97 pp. 213–216 (1997) that the switching characteristic can be improved by reducing the concentration of impurities in the anode layer to reduce the diffusion depth of this layer and introducing a lifetime killer to make the temperature coefficient of the ON-voltage positive. In addition, M. Mori et al. have reported in Proc. of IEEE ISPSD '91 pp. 113–117 (1991) that the switching characteristic can be improved by connecting Shottky and pn diodes together in parallel inside a single cell and restraining injection of minority carriers from the anode layer to make the temperature coefficient of the ON-voltage positive.

In the above pn diodes, however, since the concentration of impurities in the anode layer has been reduced to reduce the diffusion depth, application of a reverse bias voltage to the pn diode causes the anode layer to be punched-through with a low voltage, thereby hindering a withstand voltage from being obtained.

In addition, in the combination of Shottky and pn diodes, due to the very small diffusion depth of the Shottky diode portion and the use of a (p) layer having a low concentration of impurities, the Shottky barrier height cannot be controlled easily, thereby varying the ON-voltage or its temperature or switching characteristic.

In view of the above, it is an object of the present invention to solve these problems and to provide a semiconductor device that has a positive ON-voltage temperature coefficient and a high switching speed at the current density provided during actual operations.

SUMMARY OF THE INVENTION

In order to attain the above object, the present invention provides a semiconductor device comprising a first conductivity-type base layer having high resistance, a second conductivity-type anode layer formed on one surface of the first conductivity-type base layer, an anode electrode formed on a surface of the second conductivity-type anode layer, a cathode layer formed on the other surface of the first conductivity-type base layer, and a cathode electrode formed on a surface of the cathode layer, wherein said anode electrode is secured to a part of the second conductivity-type anode layer, and the ratio of areas $S_1/S_2$ is between 5 and 30, where $S_1$ is the area over which said anode electrode is not secured to the second conductivity-type anode layer, and $S_2$ is the area in which the anode electrode is not secured to the second conductivity-type anode layer.

An insulating film is interposed between the second conductivity-type anode layer and the anode electrode so that the second conductivity-type anode layer and the anode electrode are not fixed together.

The semiconductor device has a plurality of spaced areas over which the second conductivity-type anode layer and the anode electrode are fixed together, and these areas constitute stripes, arcs, rings, or islands.

The second conductivity-type anode layer, the first conductivity-type base layer, and the first conductivity-type cathode layer are preferably subjected to electron beam irradiation or heavy metal diffusion.

By contacting the main electrode only with a portion of the second conductivity-type anode layer as described above, a current flowing through the device flows across the second conductivity-type anode layer. Due to the high concentration of impurities, the second conductivity-type anode layer performs almost unipolar operations while the device is ON. Thus, with an increase in temperature, the mobility and diffusion coefficient of the second conductivity-type anode layer decrease, thus causing the resistance (of MOSFETs or other devices) to increase. Consequently, the ON-voltage has a positive temperature coefficient.

In addition, the switching speed can be increased by introducing a lifetime killer by means of electron beam irradiation or heavy metal diffusion.

BRIEF DESCRIPTION OF THE DRAWINGS

FIG. 3 shows the temperature dependency of the relation between ON-voltage and ON-current for each experimental pn diode shown in FIG. 1.

FIG. 4 shows the temperature dependency of the relation between ON-voltage and ON-current for each experimental pn diode shown in FIG. 1.

FIG. 6 shows variations on the planar pattern of the embodiment in FIG. 1.

DETAILED DESCRIPTION OF THE PREFERRED EMBODIMENTS

An embodiment of the present invention will be described below with reference to the drawings. Although the following embodiment will be described assuming that the first conductivity type is an (n) type layer while the second conductivity type is a (p) type layer, (n) and (p) may be reversed between the layers.

Figure 1:
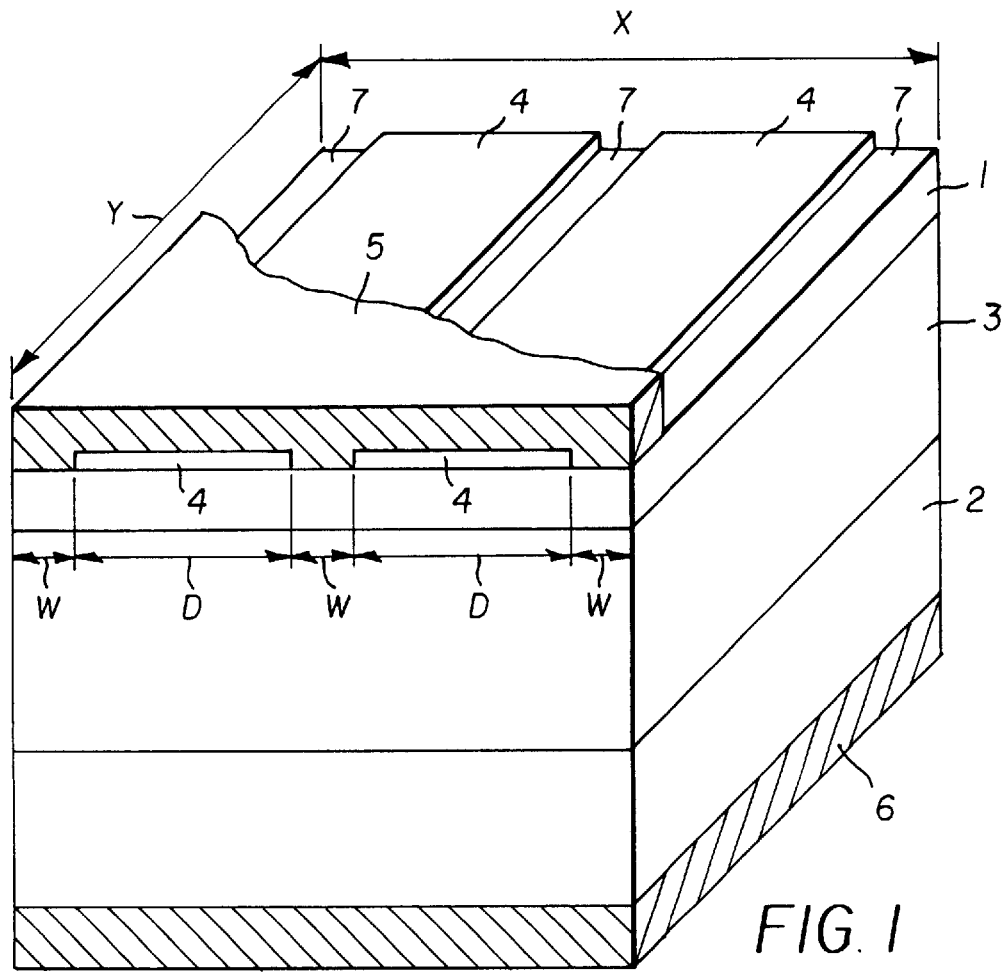
FIG. 1 is a perspective sectional view of a pn diode according to one embodiment of the present invention.

FIG. 1 is a perspective sectional view of a pn diode according to one embodiment of the present invention. A (p) anode layer 1 is formed on one surface of an (n) base layer 3 having high resistance, whereas an (n) cathode layer 2 is formed on the other surface. The surface of the (p) anode layer 1 is coated with an insulating film having contact slots formed therein, and an anode electrode 5 is formed on the (p) anode layer 1 and is secured to the (p) anode layer 1 at the locations of the contact slots 7. A cathode electrode 6 is formed on the (n) cathode layer 2. In addition, the planar pattern of the contact slots 7 is striped. The ratio of areas $S_1/S_2$ is 5 or more and 30 or less, where $S_1$ is the area on the (p) anode layer 1 that is occupied by an insulating film 4 (the area of a non-secured portion), and $S_2$ is the area of the locations of the contact slots 7 (the area of the secured portion). In addition, to reduce the switching time, the pn diode is irradiated with electron beams to shorten the lifetime.

The manufacture of the above device will now be described in greater detail. A semiconductor substrate was provided by diffusing phosphorus, which is an (n) type impurity, from one surface of an (n) type wafer having a resistivity of 150Ω·cm and a depth of 350 μm until the phosphorus reached a depth of 150 μm, thereby forming an (n)$^+$layer. This n$^+$layer acted as the (n) cathode layer 2. Boron at a dose of about $3.0 \times 10^{13}$ / cm$^2$ was ion-injected into a surface of the semiconductor substrate opposed to the n$^+$layer and was subsequently drive-in diffused by means of heat treatment at about 1,150° C. for about 5 hours. The diffusion depth $X_j$ of boron was about 5 μm. This diffusion layer acted as the (p) anode layer 1.

Subsequently, the insulating film 4 was coated on the surface of the p) anode layer 1, and the contact slots 7 were formed on the insulating film 4. The anode electrode 5 was formed in the portions in which the (p) anode layer 1 was exposed and on the insulating film 4. The anode electrode 5 and the p) anode layer 1 were fixed together at the locations of the contact slots 7.

The contact slots 7 were formed on the insulating film 4 in the shape of stripes (FIG. 1 shows the striped contact hole 7 pattern). The pn diodes were experimentally produced by setting the width W of the contact slots at a fixed value of 6 μm and the interval D of the contact slots at 30 μm (experimental device 1), 60 μm (experimental device 2), 120 μm (experimental device 3), or 180 μm (experimental device 4) so that the area ratio $S_1/S_2$ of the area $S_1$ on the (p) anode layer 1 that was occupied by the insulating film 4 (the area of the non-secured portion) to the area $S_2$ of the locations of the contact slots 7 (the area of the secured portion) was 5, 10, 20, or 30. If the breadth of the (p) anode layer and its longitudinal length are defined as X and Y, respectively, then the surface area of the (p) anode layer will be X×Y, that is, $S_1+S_2$.

In addition, to reduce the switching time, each pn diode was irradiated with about 10-Mrad of electron beams to shorten the lifetime. Of course, the lifetime may be shortened by using a heavy metal such as gold or platinum.

Figure 2:
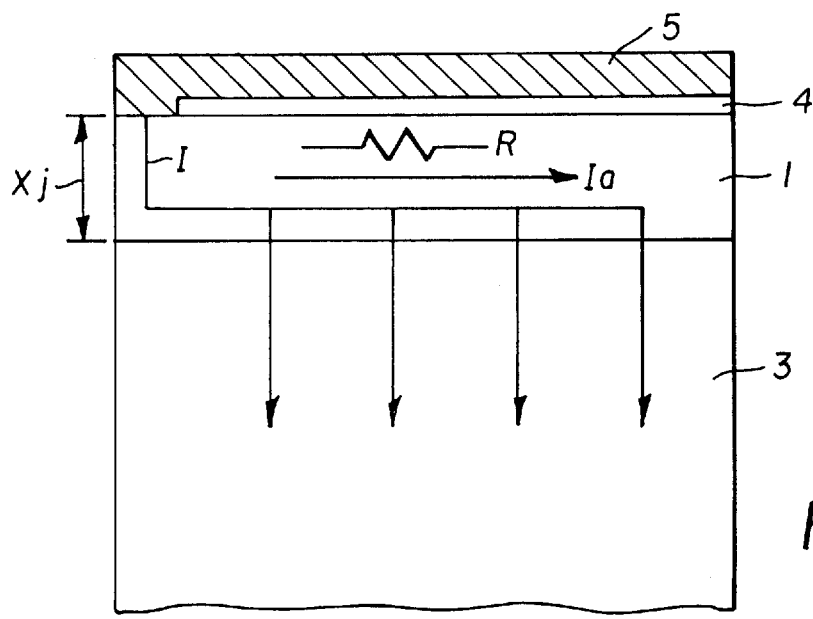
FIG. 2 is an explanatory drawing of the operation of the pn diode in FIG. 1.

By reducing the dose of the (p) anode layer 1 and the diffusion depth $X_j$ as described above, the current density of the current $I_a$ crossing the (p) anode layer 1 increased and the lateral resistance R increased, as shown in FIG. 2 (which is an enlarged view of the area around the (p) anode layer in FIG. 1). The temperature coefficient of the ON-voltage could thereby be effectively made positive. In addition, the lifetime could be shortened to obtain a high switching speed.

Figure 3A:
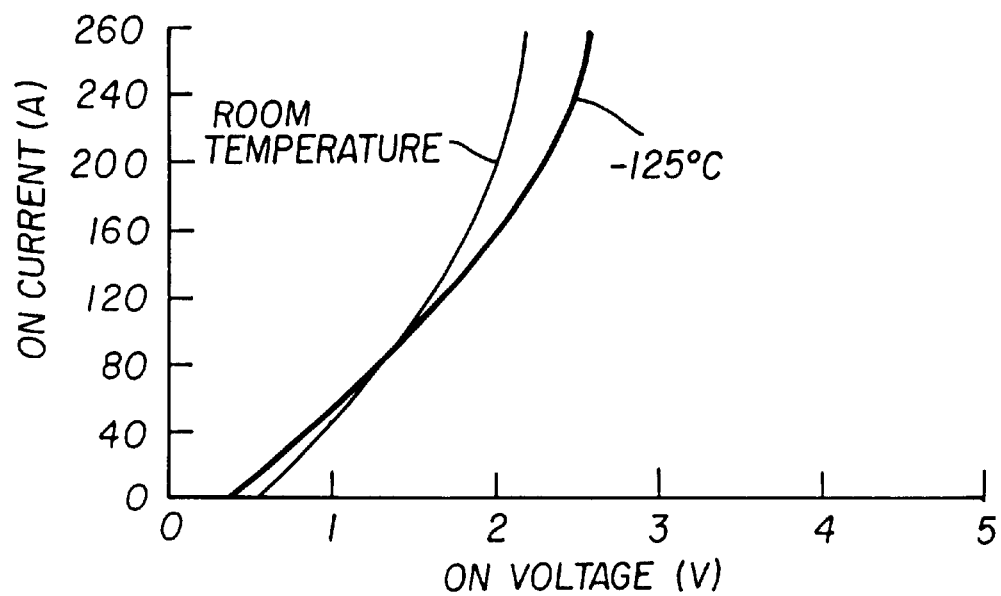
FIG. 3(a) shows experimental device 1.
Figure 3B:
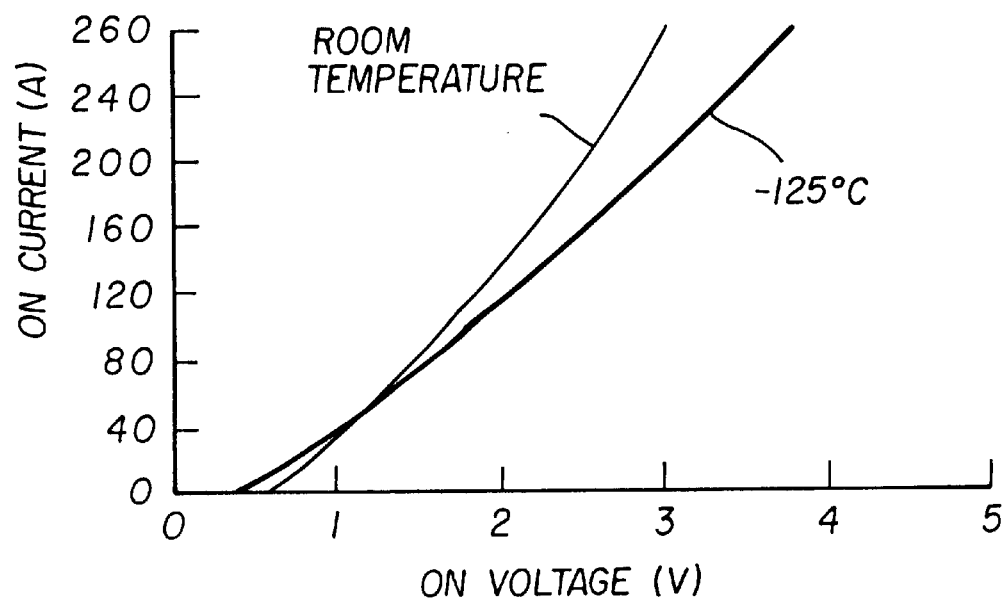
FIG. 3(b) shows experimental device 2.
Figure 4A:
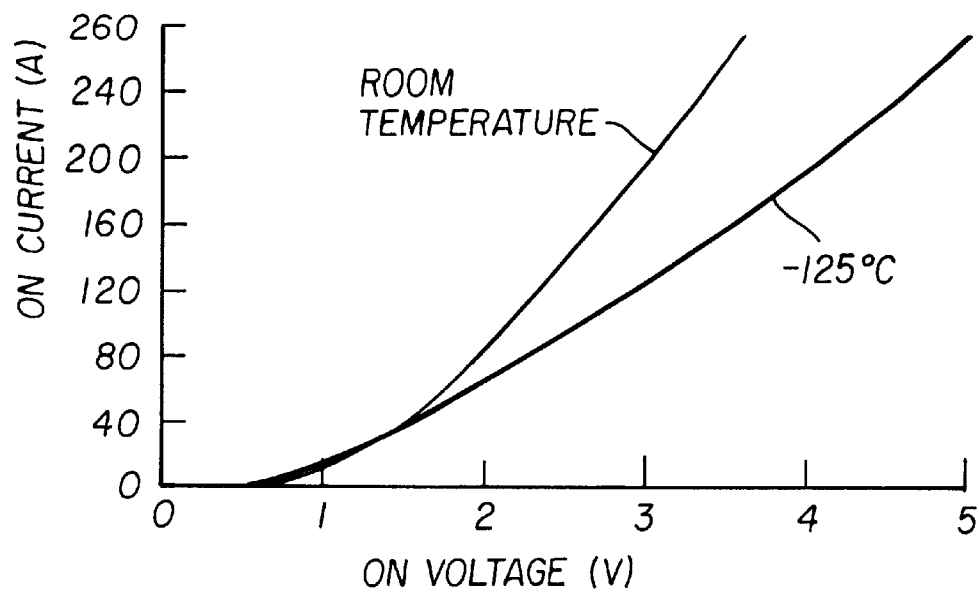
FIG. 4(a) shows experimental device 3.
Figure 4B:
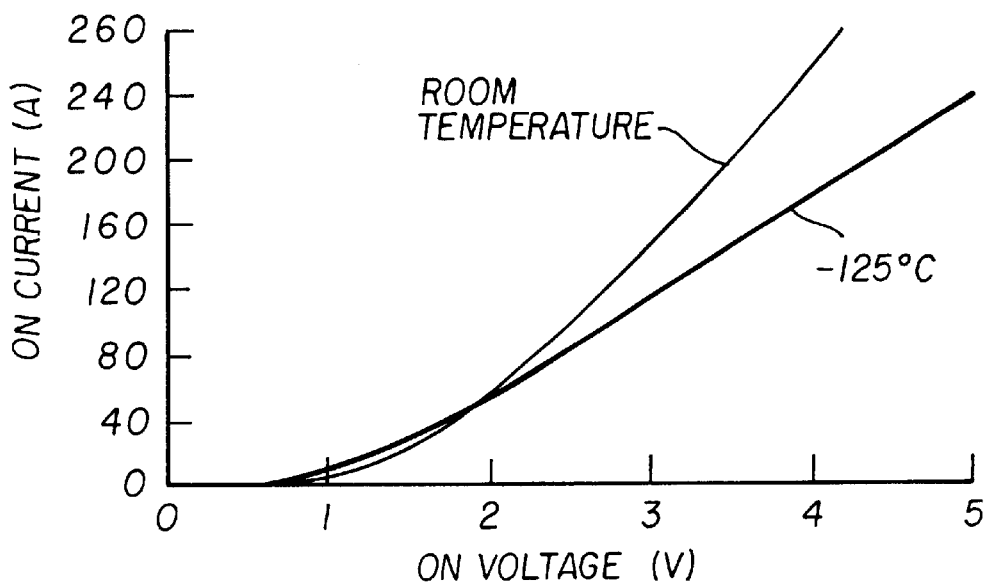
FIG. 4(b) shows experimental device 4.

FIGS. 3 and 4 shows the temperature dependency of the relation between ON-voltage and ON-current curve for each experimental pn diode, which is shown in FIG. 1. FIG. 3(a) shows such a curve for experimental device 1, and FIG. 3(b) shows such a curve for experimental device 2. FIG. 4 (a) shows such a curve for experimental device 3, and FIG. 4 (b) shows such a curve for experimental device 4. These experimental devices were 1 cm$^2$ in chip size.

In FIGS. 3 and 4, when an ON-current for actual use is 200 A, the value of (the ON-voltage at 125° C. minus the ON-voltage at room temperature)/(the ON-voltage at room temperature) is defined as the temperature coefficient. When this value is negative, the temperature coefficient is negative; and when this value is positive, the temperature coefficient is positive. In addition, the magnitude of the value represents the magnitude of the rate of change of the ON-voltage as a function of temperature.

The measurement results showed that experimental device 1 had a temperature coefficient of +0.1 and an ON-voltage of 2.0 V at room temperature, that experimental device 2 had a temperature coefficient of +0.2 and an ON-voltage of 2.5 V, that experimental device 3 had a temperature coefficient of +0.3 and an ON-voltage of 3.0 V, and that experimental device 4 had a temperature coefficient of +0.5 and an ON-voltage of 3.5 V.

For comparison, pn diodes were experimentally produced that had a contact slot width of 6 μm and a contact slot interval of 20 μm (comparative device 1) or 200 μm (comparative device 1) or 200 μm (comparative device 2) and that had a structure similar to that in FIG. 1. Although this is not shown, comparative device 1 had a temperature coefficient of −0.1 and an ON-voltage of 2.4 V and comparative device 2 had a temperature coefficient of +1 and an ON-voltage of 4.5 V.

In addition, a conventional pn diode (with the anode electrode formed all over the (p) anode layer) was found to have a temperature coefficient of −0.5 and an ON-voltage of 2.3 V.

These results indicate that when the width D of the insulating film is smaller than that of experimental device 1, the temperature coefficient is negative. Moreover, when the width D of the insulating film is larger than that of experimental device 4, the lateral resistance of the (p) anode layer increases to excessively increase the absolute value of the ON-voltage. In addition, the current may concentrate on the locations of the contact slots 7, thereby destroying the device.

The results of experimental manufacture show that good results are obtained when the contact slot width is 6 μm and when the contact slot interval (the width D of the insulating film) is between 30 and 180 μm. This, in turn, indicates that good results are obtained when the above area ratio $S_1/S_2$ is between 5 and 30. Incidentally, when $S_1/S_2$ was between 5 and 30, similar results could be obtained even when the contact slot width W was changed.

In addition, the experimental devices (experimental devices 1 to 4) had almost the same reverse recovery current and time as the comparative devices (comparative devices 1 and 2). The reverse recovery time was between 630 and 650 nsec, and the reverse recovery current was between 1,100 and 1,200 A.

Figure 5:
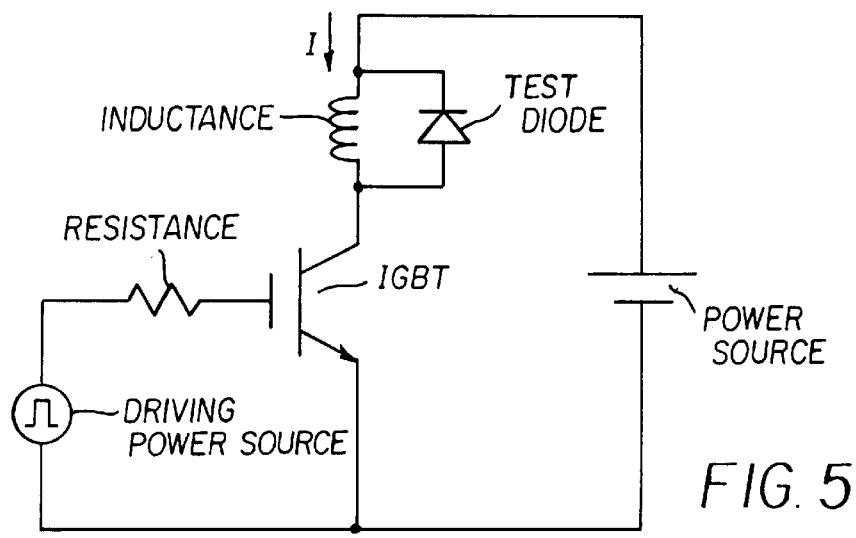
FIG. 5 is a circuit diagram of an IGBT turn-off test circuit.

In addition, an IGBT turn-off test circuit in FIG. 5 was used to test the diodes for reverse recovery withstand capability. To operate this circuit, an IGBT 11 is turned ON to store energy of $(1/2)LI^2$ in an inductor L, and the IGBT 11 is then turned OFF. Then, a current flowing through L starts to flow through an experimental diode 12. When the IGBT 11 is then turned ON, a current begins to flow through the experimental diode 12 in the opposite direction to that of the current previously flowing through it, such that the original current is canceled out. The experimental diode 12 enters a reverse recovery process and is turned OFF after a reverse recovery current has flowed for a period of time corresponding to the reverse recovery time. At this point, if the reverse recovery current is large and the reverse recovery time is long, reverse recovery losses increase to the point that the experimental diode 12 is destroyed. In the experiments, three experimental diodes 12 were connected in parallel. When the experimental diodes 12 comprised conventional diodes, they were destroyed when the turn-off current of the IGBT 11 was 1,200 A. The diodes according to the present invention (experimental devices 1 to 4), however, were not destroyed even when the turn-off cutoff of the IGBT 11 was increased up to 6,000. A. This is because the positive temperature coefficient of the diodes according to the present invention substantially improves the balance between the currents through the three diodes connected in parallel.

Figure 6A:
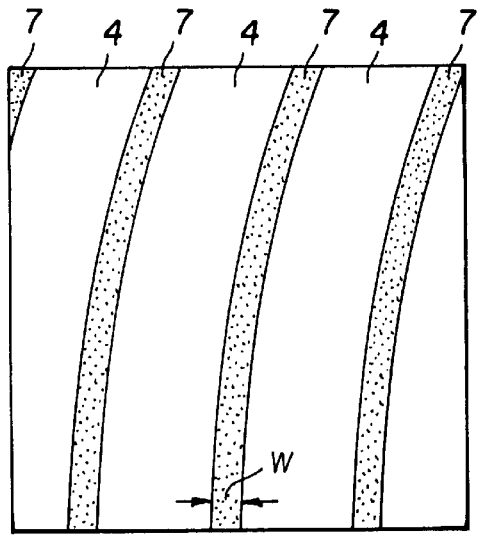
FIG. 6(a) is a circular-arc pattern.
Figure 6B:
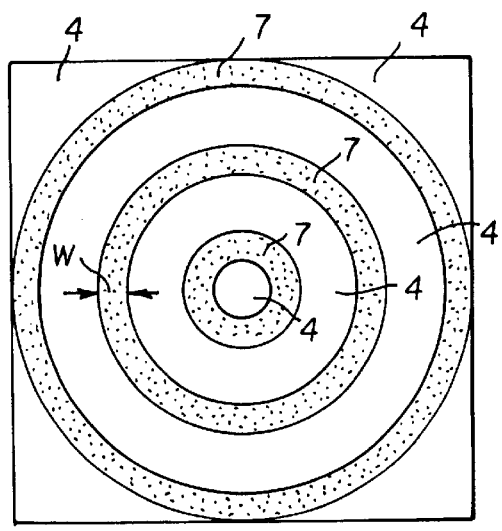
FIG. 6(b) is a ring pattern.
Figure 6C:
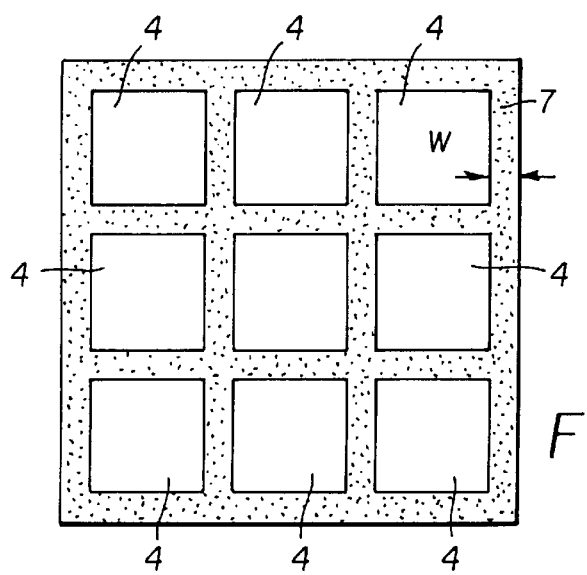
FIG. 6(c) shows an island pattern.

FIG. 6 shows a variation of the planar pattern of the embodiment in FIG. 1. FIG. 6 (a) shows a circular-arc pattern, FIG. 6(b) shows a ring pattern, FIG. 6(c) is an island pattern. These planar patterns show the insulating film on the (p) anode layer. With any of the patterns, effects similar to those described above can be obtained by setting the above area ratio $S_1/S_2$ to between 5 and 20 to shorten the lifetime as described above. Incidentally, these patterns are only illustrative, and although, for example, FIG. 6(c) shows square-shaped islands, they may of course be shaped like circles or polygons.

Although this embodiment has been described in conjunction with the (p) anode layer of dose $3.0 \times 10^{13}$ / $cm^{-2}$, the results of simulation show that similar results can be obtained within a range between $1.0 \times 10^{13}$ / $cm^{-2}$ and $3.0 \times 10^{14}$ / $cm^{-2}$.

According to the present invention, the temperature coefficient of the pn diode can be made positive by fixing the anode electrode to a portion of the (p) anode layer and setting the ratio of area $S_1$ (the non-secured portion) to area $S_2$ (the secured portion) to between 5 and 30.

In addition, the switching time can be reduced by means of electron beam irradiation or heavy metal diffusion. Further, the reverse recovery withstand voltage can be improved.

What is claimed is:

1. A semiconductor device comprising:
   a first conductivity-type base layer having high resistance;
   a second conductivity-type anode layer formed on one surface of the first conductivity-type base layer;
   an anode electrode formed on a surface of the second conductivity-type anode layer;
   a cathode layer formed on the other surface of the first conductivity-type base layer; and
   a cathode electrode formed on a surface of the cathode layer;
   wherein said anode electrode is secured to a part of the second anode layer, and the ratio of areas $S_1/S_2$ is between 5 and 30, where $S_1$ is the area over which said anode electrode is not secured to the second conductivity-type anode layer, and $S_2$ is the area in which the anode electrode is secured to the second conductivity-type anode layer.

2. A semiconductor device according to claim 1, wherein an insulating film is interposed between said second conductivity-type anode layer and said anode electrode so that the second conductivity-type anode layer and the anode electrode are not fixed together.

3. A semiconductor device according to claim 1, wherein the device has a plurality of spaced areas each having said second conductivity-type anode layer and said anode electrode fixed together, and in that said areas constitute stripes, circular arcs, rings, or islands.

4. A semiconductor device according to claim 1, wherein said second conductivity-type anode layer, said first conductivity-type base layer, and said first conductivity-type cathode layer are subjected to electron beam irradiation or heavy metal diffusion.

* * * * *